(12) United States Patent
Hong et al.

(10) Patent No.: US 11,935,922 B2
(45) Date of Patent: *Mar. 19, 2024

(54) SEMICONDUCTOR DEVICE HAVING STEPPED MULTI-STACK TRANSISTOR STRUCTURE

(71) Applicant: SAMSUNG ELECTRONICS CO., LTD., Suwon-si (KR)

(72) Inventors: Byounghak Hong, Albany, NY (US);
Seunghyun Song, Albany, NY (US);
Kang Ill Seo, Albany, NY (US);
Hwichan Jun, Albany, NY (US);
Inchan Hwang, Schenectady, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/970,777

(22) Filed: Oct. 21, 2022

(65) Prior Publication Data
US 2023/0037833 A1 Feb. 9, 2023

Related U.S. Application Data

(63) Continuation of application No. 17/146,136, filed on Jan. 11, 2021, now Pat. No. 11,502,167.
(Continued)

(51) Int. Cl.
*H01L 29/06* (2006.01)
*H01L 27/092* (2006.01)
(Continued)

(52) U.S. Cl.
CPC ........ *H01L 29/0665* (2013.01); *H01L 27/092* (2013.01); *H01L 29/41775* (2013.01); *H01L 29/42392* (2013.01); *H01L 29/78696* (2013.01)

(58) Field of Classification Search
CPC ............... H01L 29/0665; H01L 27/092; H01L 29/41775; H01L 29/42392;
(Continued)

(56) References Cited

U.S. PATENT DOCUMENTS 9,953,882 B2   4/2018  Jacob
9,991,261 B2   6/2018  Mitard
(Continued)

OTHER PUBLICATIONS

Communication dated Oct. 22, 2021 by the European Patent Office in counterpart European Patent Application No. 21178008.5.

*Primary Examiner* — Tong-Ho Kim
(74) *Attorney, Agent, or Firm* — Sughrue Mion, PLLC

(57) ABSTRACT

A semiconductor device include: a substrate; a $1^{st}$ transistor formed above the substrate, the $1^{st}$ transistor including a $1^{st}$ channel set of a plurality of $1^{st}$ nanosheet layers, a $1^{st}$ gate structure surrounding the $1^{st}$ nanosheet layers, and $1^{st}$ and $2^{nd}$ source/drain regions at both ends of the $1^{st}$ channel set; and a $2^{nd}$ transistor formed above the $1^{st}$ transistor in a vertical direction, the $2^{nd}$ transistor including a $2^{nd}$ channel set of a plurality of $2^{nd}$ nanosheet layers, a $2^{nd}$ gate structure surrounding the $2^{nd}$ nanosheet layers, and $3^{rd}$ and $4^{th}$ source/drain regions at both ends of the $2^{nd}$ channel set, wherein the $1^{st}$ channel set has a greater width than the $2^{nd}$ channel set, wherein a number of the $1^{st}$ nanosheet layers is smaller than a number of the $2^{nd}$ nanosheet layers, and wherein a sum of effective channel widths of the $1^{st}$ nanosheet layers is substantially equal to a sum of effective channel width of the $2^{nd}$ nanosheet layers.

14 Claims, 16 Drawing Sheets

Related U.S. Application Data

(60) Provisional application No. 63/086,781, filed on Oct. 2, 2020.

(51) Int. Cl.
*H01L 29/417* (2006.01)
*H01L 29/423* (2006.01)
*H01L 29/786* (2006.01)

(58) Field of Classification Search
CPC ....... H01L 29/78696; H01L 21/823871; H01L 29/775; H01L 21/823412; H01L 21/823418; H01L 21/823475; H01L 27/088; H01L 27/0924; H01L 29/66439; H01L 21/8221; H01L 21/823807; H01L 21/823814; H01L 27/0688; H01L 27/0886; H01L 29/0684; H01L 29/0847; H01L 29/785; H01L 21/823828; H01L 29/0673; B82Y 10/00
USPC ........................................................ 257/288
See application file for complete search history.

(56) References Cited

U.S. PATENT DOCUMENTS

| | | |
|---|---|---|
| 10,164,121 B2 | 12/2018 | Hatcher et al. |
| 10,685,887 B2 | 6/2020 | Smith et al. |
| 11,502,167 B2* | 11/2022 | Hong .................. H01L 27/0688 |
| 2019/0088553 A1 | 3/2019 | Van Dal et al. |
| 2019/0148243 A1 | 5/2019 | Van Dal et al. |
| 2019/0172755 A1 | 6/2019 | Smith et al. |
| 2019/0172828 A1 | 6/2019 | Smith et al. |
| 2019/0214469 A1 | 7/2019 | Paul et al. |
| 2019/0319095 A1 | 10/2019 | Zhang et al. |
| 2019/0326286 A1 | 10/2019 | Xie et al. |
| 2019/0393214 A1* | 12/2019 | Lilak ................ H01L 21/823431 |
| 2020/0020587 A1* | 1/2020 | Cheng .................. H01L 27/092 |
| 2020/0098859 A1 | 3/2020 | Reboh et al. |
| 2020/0105751 A1 | 4/2020 | Dewey et al. |
| 2020/0203341 A1 | 6/2020 | Barraud et al. |
| 2020/0294969 A1 | 9/2020 | Rachmady et al. |
| 2021/0184000 A1* | 6/2021 | Ramaswamy ...... H01L 27/0688 |
| 2021/0280582 A1* | 9/2021 | Lu ....................... H01L 29/0847 |
| 2022/0013521 A1 | 1/2022 | Zhang et al. |

* cited by examiner

II-II'

III-III'

IV-IV'

SEMICONDUCTOR DEVICE HAVING STEPPED MULTI-STACK TRANSISTOR STRUCTURE

CROSS-REFERENCE TO THE RELATED APPLICATION

This is a Continuation of U.S. application Ser. No. 17/146,136 filed Jan. 11, 2021, which is based on and claims priority from U.S. Provisional Application No. 63/086,781 filed on Oct. 2, 2020 in the U.S. Patent and Trademark Office, the disclosure of which is incorporated herein in its entirety by reference.

BACKGROUND

1. Field

Apparatuses and methods consistent with example embodiments of the inventive concept relate to a semiconductor device and, more particularly, to a multi-stack transistors having a step structure.

2. Description of the Related Art

In an effort to boost the performance and miniaturization of semiconductor devices, a fin field-effect transistor (finFET) was introduced in which a channel structure is protruded from a substrate to form a slim fin-shaped channel region, and a gate structure is draped over the fin to surround an upper surface and two side surfaces of the channel region. The finFET, however, has a problem of a small effective channel width ($W_{eff}$) limiting an amount of current flow through the slim fin-shaped channel region. Further, there occurs a current leakage through a bottom surface of the slim fin-shaped channel region contacting the substrate formed of silicon (Si) to further limit the performance of the finFET.

To address the above problems of the finFET channel structure, a nanosheet has been introduced. The nanosheet goes by various different names such as multi-bridge channel FET (MBCFET), nanobeam, nanoribbon, superimposed channel device, etc.

FIG. 1 illustrates a related art nanosheet structure for a semiconductor device. A nanosheet structure 100 shown in FIG. 1 includes a plurality of nanosheet channel layers 110 which are vertically stacked above a substrate 105 in an overlapping manner in a D3 direction. Hereafter, the term "nanosheet channel layer(s)" is referred to as "nanosheet layer(s)." The nanosheet layers 110, functioning as channels of a transistor formed by the nanosheet structure 100, are completely surrounded by a gate structure 115 except at their open ends formed at two opposite sides of the gate structure 115 where source/drain regions are to be grown to complete the nanosheet structure 100 as a single nanosheet transistor such as a metal-oxide-semiconductor FET (MOSFET). That is, the nanosheet structure of FIG. 1 enables a single transistor having multiple channels between source/drain regions unlike the conventional planar FET or finFET. In FIG. 1A, source/drain regions are intentionally omitted from the nanosheet structure 100 only to show how the nanosheet layers 110 take a form of respectively penetrating the gate structure 115 in a D2 direction which is a channel length direction of the nanosheet structure 100.

The substrate 105 may be a bulk substrate of a semiconductor, for example, of Si, the nanosheet layers 110 may also be formed of Si, and the gate structure 115 may be formed of a conductor metal and a gate dielectric layer. The conductor metal may be tungsten (W) or aluminum (Al), and the dielectric may include silicon oxide (SiO) or metal silicate for electrical insulation from the nanosheet layers 110.

The plurality of nanosheet layers 110 each may have the same width in a D1 direction and the same length in the D2 direction which is perpendicular to the D1 direction. It has been known that the nanosheet layers 110 provide a semiconductor device formed thereof with not only a device density gain but also an increased $W_{eff}$ to allow a greater amount of current to flow through the plurality nanosheet layers 110 between the source/drain regions.

However, technology to reduce the size of a single transistor is limited even if the transistor is formed of multiple channel layers like the nanosheet layers 110.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

The inventive concept provides a semiconductor device having a stepped nanosheet structure having different channel region widths between nanosheet layers.

According to embodiments, there is provided a semiconductor device which may include: a substrate; a $1^{st}$ transistor formed above the substrate, the $1^{st}$ transistor including a $1^{st}$ channel set of a plurality of $1^{st}$ nanosheet layers, a $1^{st}$ gate structure surrounding the $1^{st}$ nanosheet layers, and $1^{st}$ and $2^{nd}$ source/drain regions at both ends of the $1^{st}$ channel set; and a $2^{nd}$ transistor formed above the $1^{st}$ transistor in a vertical direction, the $2^{nd}$ transistor including a $2^{nd}$ channel set of a plurality of $2^{nd}$ nanosheet layers, a $2^{nd}$ gate structure surrounding the $2^{nd}$ nanosheet layers, and $3^{rd}$ and $4^{th}$ source/drain regions at both ends of the $2^{nd}$ channel set; wherein the $2^{nd}$ source/drain region has a greater width than the $4^{th}$ source/drain region so that the $4^{th}$ source/drain region vertically overlaps only a part of the $2^{nd}$ source/drain region, wherein the semiconductor device further includes a source/drain contact structure connected to the $2^{nd}$ source/drain region through a space where the $4^{th}$ source/drain region does not vertically overlap the $2^{nd}$ source/drain region.

According to embodiments, there is provided a semiconductor device which may include: a substrate; a $1^{st}$ transistor formed above the substrate, the $1^{st}$ transistor including a $1^{st}$ channel set of a plurality of $1^{st}$ nanosheet layers, a $1^{st}$ gate structure surrounding the $1^{st}$ nanosheet layers, and $1^{st}$ and $2^{nd}$ source/drain regions at both ends of the $1^{st}$ channel set; and a $2^{nd}$ transistor formed above the $1^{st}$ transistor in a vertical direction, the $2^{nd}$ transistor including a $2^{nd}$ channel set of a plurality of $2^{nd}$ nanosheet layers, a $2^{nd}$ gate structure surrounding the $2^{nd}$ nanosheet layers, and $3^{rd}$ and $4^{th}$ source/drain regions at both ends of the $2^{nd}$ channel set, wherein the $1^{st}$ channel set has a greater width than the $2^{nd}$ channel set, wherein a number of the $1^{st}$ nanosheet layers is smaller than a number of the $2^{nd}$ nanosheet layers, and wherein a sum of effective channel widths of the $1^{st}$ nanosheet layers is substantially equal to a sum of effective channel width of the $2^{nd}$ nanosheet layers.

According to embodiments, there is provided a semiconductor device which may include: a substrate; a $1^{st}$ transistor formed above the substrate, the $1^{st}$ transistor including at least two $1^{st}$ channel layers and $1^{st}$ and $2^{nd}$ source/drain regions; and a $2^{nd}$ transistor stacked above the $1^{st}$ transistor in a vertical direction, the $2^{nd}$ transistor including at least two $2^{nd}$ channel layers and $3^{rd}$ and $4^{th}$ source/drain regions; wherein the $2^{nd}$ source/drain region is partially overlapped by the $4^{th}$ source/drain region in a vertical direction, wherein at least one of the two $1^{st}$ channel layers is not vertically overlapped by any one of the $2^{nd}$ channel layers, and wherein the semiconductor device further includes a source/drain contact structure connected to the $2^{nd}$ source/drain region through a space where the $4^{th}$ source/drain region does not overlap the $2^{nd}$ source/drain region in the vertical direction.

The structural characteristics of the disclosed semiconductor device according to the above embodiments may enable at least to obtain a more space for direct and straight connections of source/drain contact structure with source/drain regions of transistors included in the semiconductor device.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
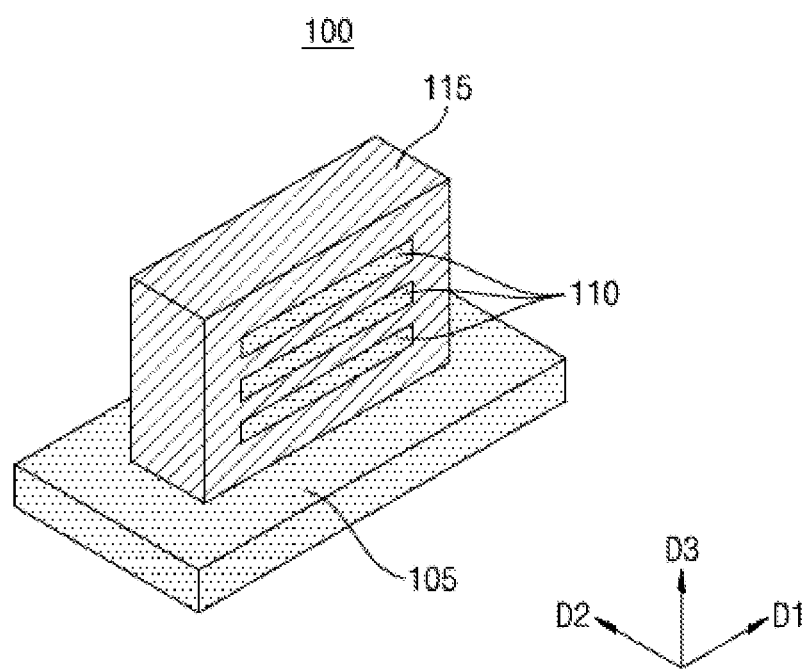
FIG. 1 illustrates a related art nanosheet structure for a semiconductor device.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

It will be understood that, although the terms first ($1^{st}$), second ($2^{nd}$), third ($3^{rd}$) fourth ($4^{th}$) etc. may be used herein to describe various elements, these elements should not be limited by these terms. These terms are only used to distinguish one element from another element. Thus, even if a "second ($2^{nd}$)" element is recited in the claims without a "first a first ($1^{st}$)" element in the specification or claims, the "second ($2^{nd}$)" element may still distinguish from another element, and a "second ($2^{nd}$)" element described in the specification may be termed as a "first ($1^{st}$)" element in the claims.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

It is understood in advance that some elements shown in the drawings without reference numbers or characters are those included in conventional semiconductor devices and well known in the field. For example, dielectric layers are provided in corresponding positions of the semiconductor devices to insulate neighboring elements. For example, these dielectric layers may be formed of silicon or silicon compound such as SiO, $SiO_2$, silicon nitride (SiN), not being limited thereto. It is also understood that some elements common to conventional semiconductor devices may be omitted in the following descriptions as well as in the drawings for brevity.

According to an embodiment, the nanosheet structure 100 shown in FIG. 1 can also be stacked vertically to constitute a multi-stack nanosheet structure to achieve an increased device density gain.

Figure 2A:
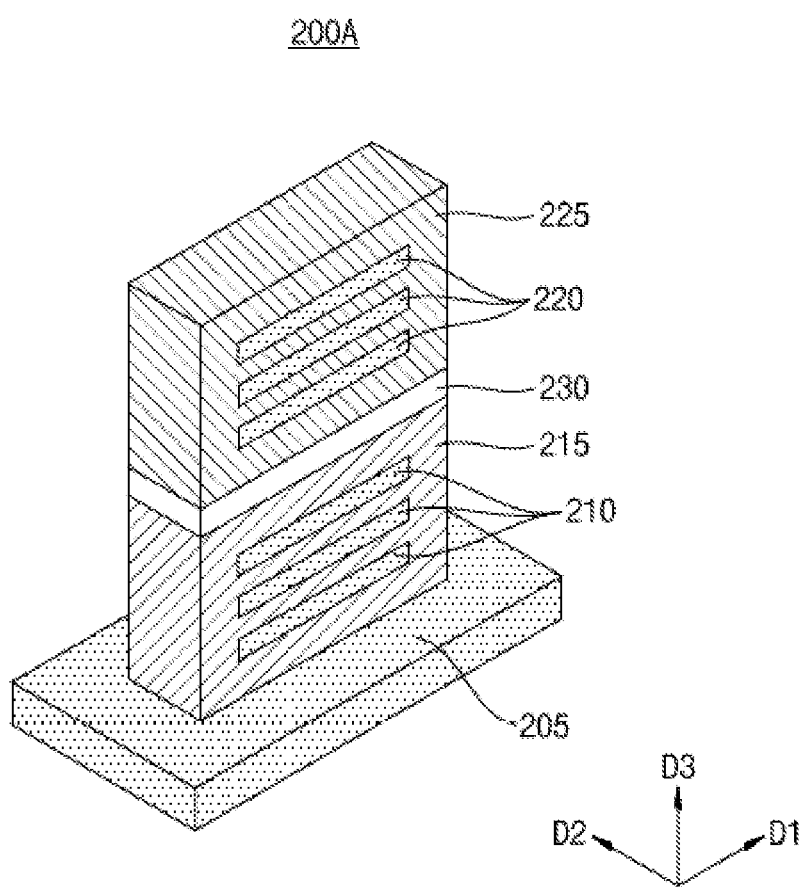
FIG. 2A illustrates a multi-stack nanosheet structure, according to an embodiment.

FIG. 2A illustrates a multi-stack nanosheet structure including two sets of nanosheet layers, according to an embodiment. A multi-stack nanosheet structure 200A shown in FIG. 2 includes a $1^{st}$ channel set 210 of a plurality of $1^{st}$ nanosheet layers and a $2^{nd}$ channel set 220 of a plurality of $2^{nd}$ nanosheet layers vertically stacked above a substrate 205 in an overlapping manner in a D3 direction with an isolation layer 230 therebetween.

Each of the $1^{st}$ channel set 210 and the $2^{nd}$ channel set 220 may take a substantially same structure as the nanosheet layers 110 shown in FIG. 1. Thus, each of the $1^{st}$ nanosheet layers of the $1^{st}$ channel set 210 may have the same width and the same length as each of the $2^{nd}$ nanosheet layers of the $2^{nd}$ channel set 220. Further, the $1^{st}$ channel set and the $2^{nd}$ channel set may have the same number of nanosheet layers, for example, three as shown in FIG. 2A.

Figure 2B:
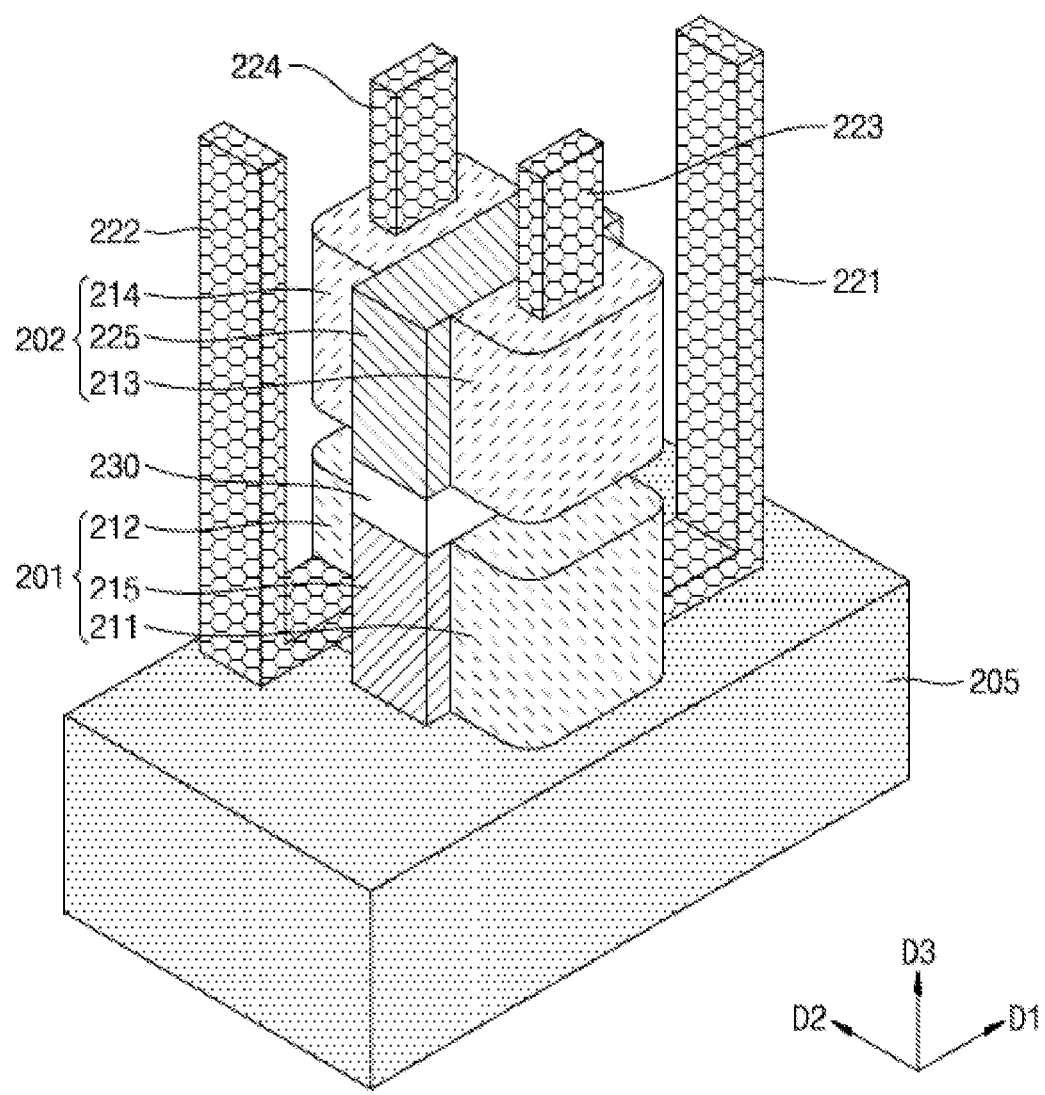
FIG. 2B illustrates a semiconductor device built from the multi-stack nanosheet structure of FIG. 2A, according to an embodiment.

Like the nanosheet layers 110 of FIG. 1, the $1^{st}$ nanosheet layers of the $1^{st}$ channel set 210 are completely surrounded by a $1^{st}$ gate structure 215 except at their open ends formed at two opposite sides of the gate structure 215 where lower source/drain regions are to be grown to build a lower transistor ($1^{st}$ transistor 201 in FIG. 2B), and the $2^{nd}$ nanosheet layers of the $2^{nd}$ channel set 220 are completely surrounded by a $2^{nd}$ gate structure 225 except at their open ends formed at two opposite sides of the gate structure 225 where source/drain regions are to be grown to build an upper transistor ($2^{nd}$ transistor 202 in FIG. 2B). Here, the lower transistor may be one of a p-type MOSFET (PMOS) and n-type MOSFET (PMOS), and the upper transistor may be the other of the NMOS and PMOS, according to an embodiment.

With this multi-stack nanosheet structure, a semiconductor device built therefrom may achieve an improved density gain.

FIG. 2B illustrates a semiconductor device built from the nanosheet structure of FIG. 2A, according to an embodiment.

Referring to FIG. 2B, a semiconductor device 200B includes the same $1^{st}$ channel set 210 (not shown) and $2^{nd}$ channel set 220 (not shown) of the multi-stack nanosheet structure 200A in FIG. 2A. In addition, the semiconductor device 200B has a $1^{st}$ source/drain region 211 and a $2^{nd}$ source/drain region 212 respectively formed at both ends of the $1^{st}$ channel set in the D2 direction where the $1^{st}$ nanosheet layers are not surrounded by the $1^{st}$ gate structure 215, thereby constituting a $1^{st}$ transistor 201, which may be an NMOS. Further, the semiconductor device 200B has a $3^{rd}$ source/drain region 213 and 214 respectively formed at both ends of the $2^{nd}$ channel set in the D2 direction where the $2^{nd}$ nanosheet layers are not surrounded by the $2^{nd}$ gate structure 225, thereby constituting a second transistor 202, which may be an PMOS. These two MOSFETs may form a commonly-used inverter circuit in semiconductor devices.

The semiconductor device 200B also includes $1^{st}$ to $4^{th}$ source/drain contact structures 221 to 224 formed of an electrically conducting material, for example a conductor metal material such as cobalt (Co), tungsten (W), ruthenium (Ru), or a combination thereof, not being limited thereto, to respectively connect the $1^{st}$ to $4^{th}$ source/drain regions to internal circuit elements and/or power sources (not shown). The source/drain contact structures 221 to 224 may be extended from other back-end-of-line (BEOL) elements such as metal patterns (not shown) formed above the transistors to be connected to the $1^{st}$ to $4^{th}$ source/drain regions, respectively. However, because the $1^{st}$ transistor 201 is vertically overlapped by the $2^{nd}$ transistor 202 having a substantially the same shape as described above, the $1^{st}$ and $2^{nd}$ source/drain contact structures 221 and 222 may be bent to be respectively connected to the $1^{st}$ and $2^{nd}$ source/drain regions 211 and 212 of the $1^{st}$ transistor respectively formed below the $3^{rd}$ and $4^{th}$ source/drain regions 213 and 214 of the $2^{nd}$ transistor 202, as shown in FIG. 2B, according to an embodiment.

According to an embodiment, the $1^{st}$ and $2^{nd}$ source/drain contact structures 221 and 222 may be connected from below, in which case metal patterns connecting the $1^{st}$ and $2^{nd}$ source/drain regions may be buried in the substrate 205.

When the $1^{st}$ and $2^{nd}$ source/drain contact structures 221 and 222 are required to be bent as shown in FIG. 2B or required to be connected to metal patterns buried in the substrate 205 for connection with the $1^{st}$ and $2^{nd}$ source/drain regions 211 and 212 of the $1^{st}$ transistor, the semiconductor device shown in FIG. 2B may have to have additional metal patterns in the BEOL structure to increase metal pitches, or bury metal patterns in the substrate 205, which will increase the size of the semiconductor device and/or add more complexity to the manufacturing process of the semiconductor device. Thus, embodiments described herebelow provide an improved multi-stack transistor structures.

Figure 3A:
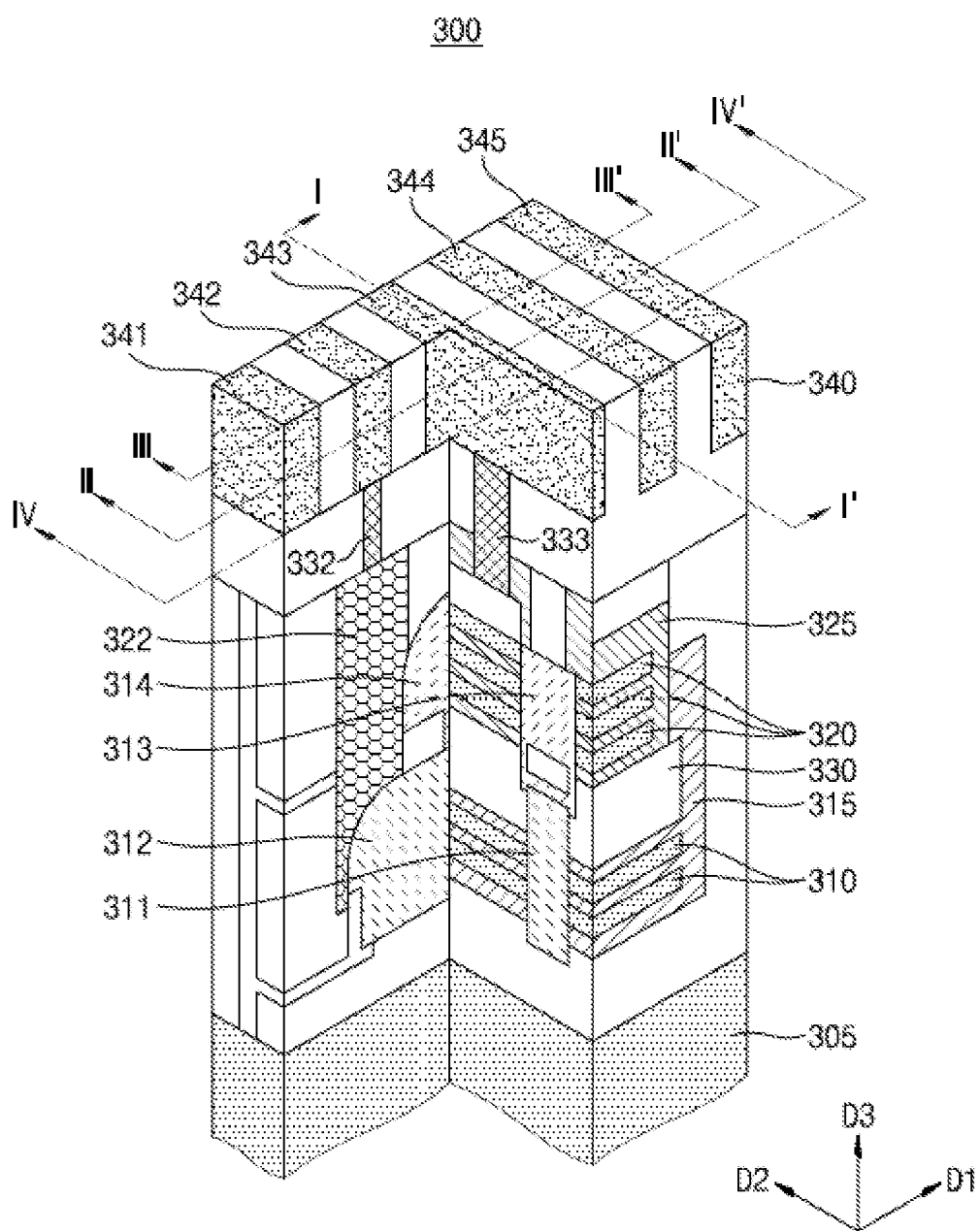
FIG. 3A illustrates an exploded perspective view of a semiconductor device including a multi-stack nanosheet structure according to embodiments.

FIG. 3A illustrates an exploded perspective view of a semiconductor device including a multi-stack nanosheet structure according to embodiments.

Figure 3B:
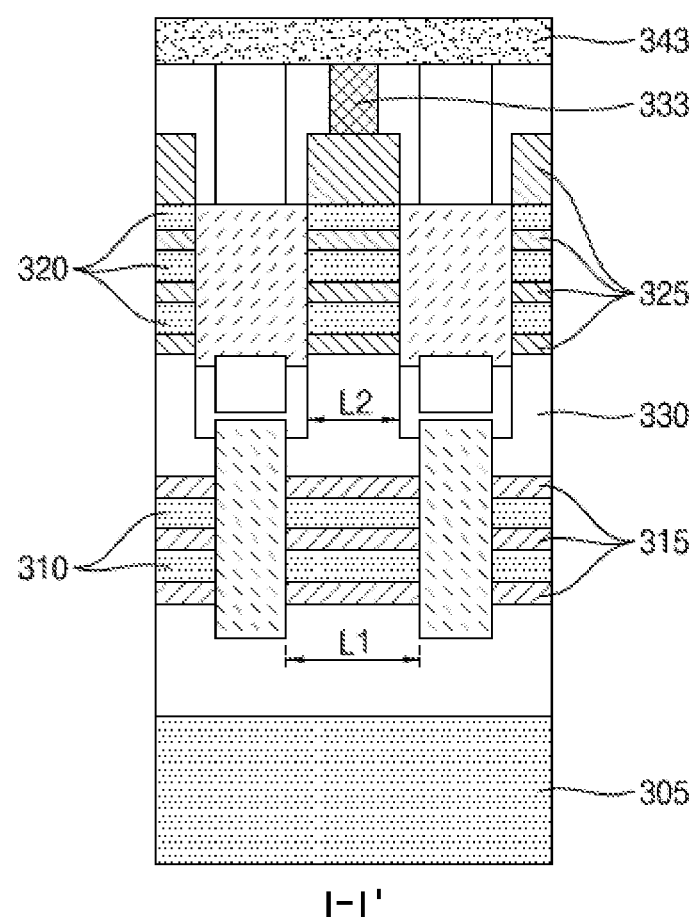
FIG. 3B illustrates a cross-sectional view of the semiconductor device taken along a line I-I' in FIG. 3A, according to an embodiment.
Figure 3C:
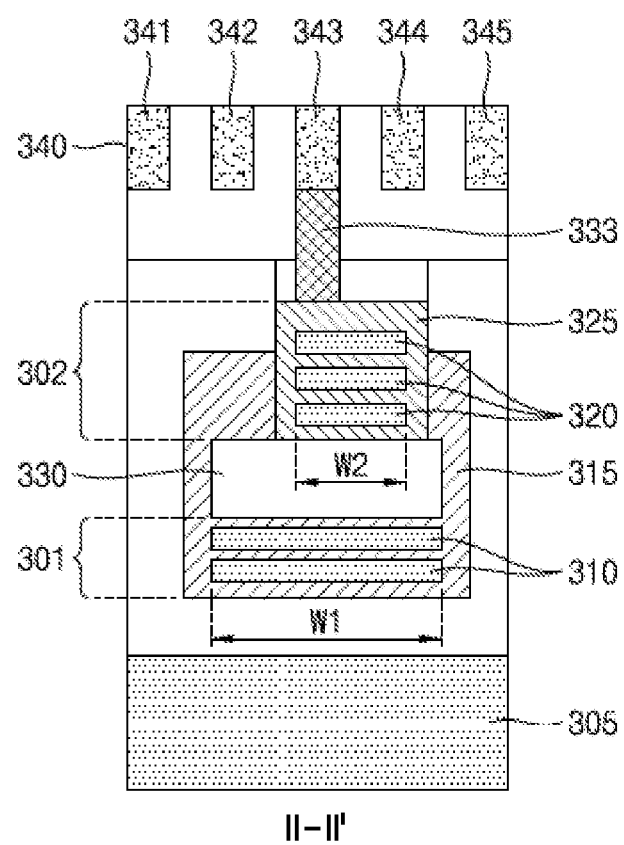
FIG. 3C illustrates a cross-sectional view of the semiconductor device taken along a line II-II' in FIG. 3A, according to an embodiment.
Figure 3D:
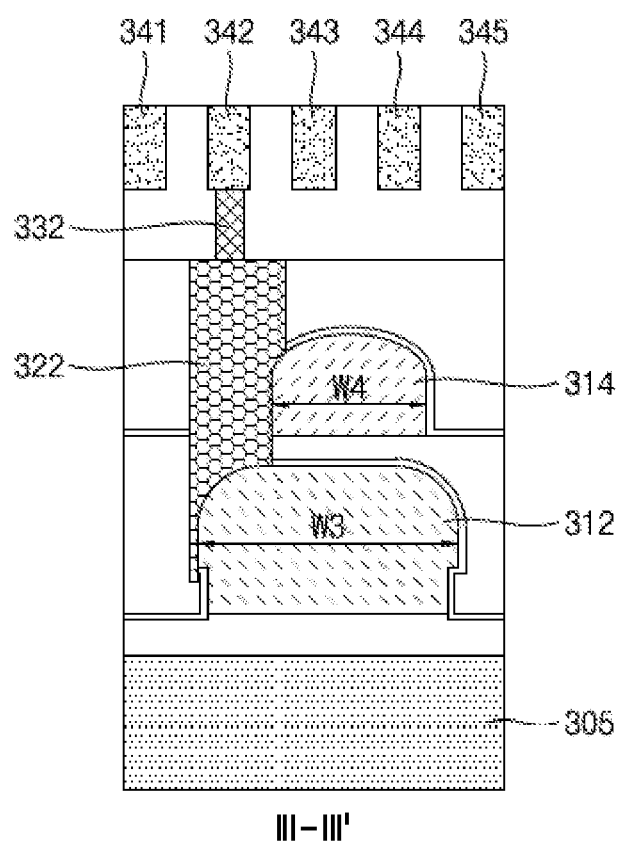
FIG. 3D illustrates a cross-sectional view of the semiconductor device taken along a line III-III' in FIG. 3A, according to an embodiment.
Figure 3E:
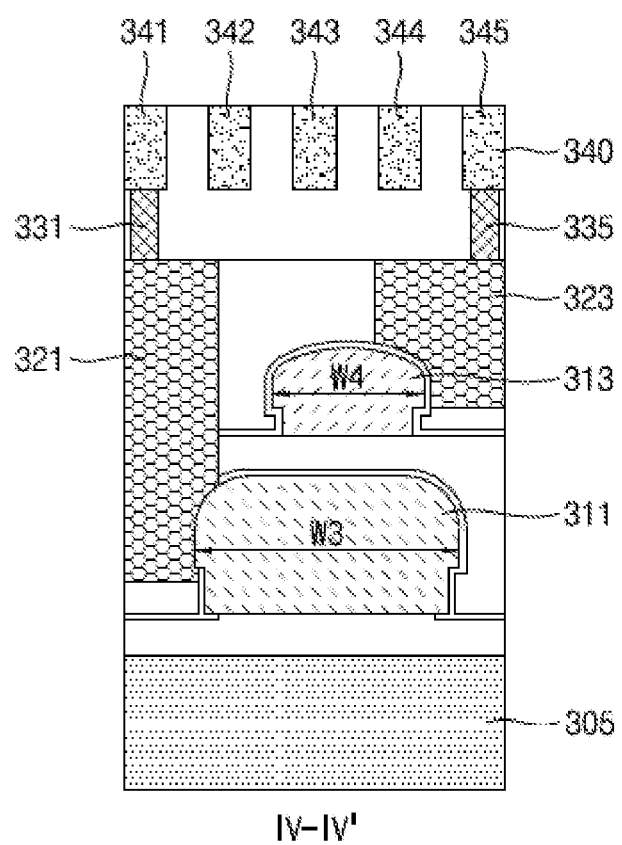
FIG. 3E illustrates a cross-sectional view of the semiconductor device taken along a line IV-IV' in FIG. 3A, according to an embodiment.
Figure 3F:
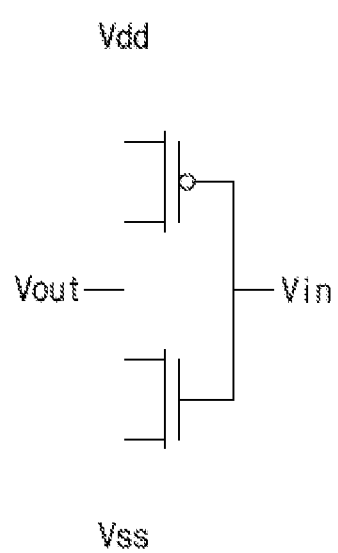
FIG. 3F is a schematic of an inverter which forms a part of the semiconductor device shown in FIG. 3A.

FIG. 3B illustrates a cross-sectional view of the semiconductor device taken along a line I-I' in FIG. 3A. FIG. 3C illustrates a cross-sectional view of the semiconductor device taken along a line II-II' in FIG. 3A. FIG. 3D illustrates a cross-sectional view of the semiconductor device taken along a line III-III' in FIG. 3A. FIG. 3E illustrates a cross-sectional view of the semiconductor device taken along a line IV-IV' in FIG. 3A. FIG. 3F is a schematic of an inverter circuit which forms a part of a semiconductor device show in FIG. 3A as described later.

Referring to FIGS. 3A to 3D, a semiconductor device 300 according to embodiments includes a multi-stack nanosheet structure basically similar to the multi-stack nanosheet structure 200A of FIG. 2A forming the semiconductor device 200B of FIG. 2B. Thus, the semiconductor device 300 includes a $1^{st}$ transistor 301 including a $1^{st}$ channel set 310 of a plurality of $1^{st}$ nanosheet layers, and a $2^{nd}$ transistor 302 including a $2^{nd}$ channel set 320 of a plurality of $2^{nd}$ nanosheet layers vertically stacked above the $1^{st}$ transistor 301 in the D3 direction. Further, each of the $1^{st}$ nanosheet layers is completely surrounded by a $1^{st}$ gate structure 315, and each of the $2^{nd}$ nanosheet layers is completely surrounded by a $2^{nd}$ gate structure 325. In addition, the $1^{st}$ nanosheet layers are vertically stacked above a substrate 305 in an overlapping manner in the D3 direction. The $1^{st}$ nanosheet layers each have the substantially same width W1 in the D1 direction and the substantially same length L1 in the D2 direction as the nanosheet layers 110 shown in FIG. 1. The $2^{nd}$ nanosheet layers each have the substantially same width W2 in the D1 direction and the substantially same length L2 in the D2 direction as the nanosheet layers 110 shown in FIG. 1.

However, the semiconductor device 300 has the following differences in its structure from the multi-stack nanosheet structure 200A and the semiconductor device 200B.

First, the $1^{st}$ nanosheet layers of the $1^{st}$ channel set 310 have greater widths than those of the $2^{nd}$ nanosheet layers of the $2^{nd}$ channel set 320 so that the semiconductor device 300 can have a stepped multi-stack nanosheet structure, according to an embodiment. Here, although FIGS. 3A-3C show that the $1^{st}$ nanosheet layers each have the same widths W1 and the $2^{nd}$ nanosheet layers each have the same widths W2 smaller than W1, the inventive concept is not limited thereto. According to an embodiment, the $1^{st}$ and $2^{nd}$ channel sets 310 and 320 may be configured such that a width of a nanosheet layer having the greatest width among the $2^{nd}$ nanosheet layers may be smaller than a width of a nanosheet layer having the smallest width among the $1^{st}$ nanosheet layers.

Second, the $2^{nd}$ channel set 320 has more nanosheet layers than the $1^{st}$ channel set 310, according to an embodiment. FIGS. 3A to 3E show that the $1^{st}$ channel set 310 has two nanosheet layers and the $2^{nd}$ channel set 320 has three nanosheet layers. However, the inventive concept is not limited thereto. According to embodiments, the two channel sets 310 and 320 may have different number of nanosheet layers as long as the $2^{nd}$ channel set 320 has more nanosheet layers than the $1^{st}$ channel set 310.

Third, according to an embodiment, although the $1^{st}$ nanosheet layers each have the same lengths, and the $2^{nd}$ nanosheet layers each have the same lengths in the D2 direction in the semiconductor device 300, these lengths of the $1^{st}$ and $2^{nd}$ nanosheet layers are different between the $1^{st}$ channel set 310 and the $2^{nd}$ channel set 320 within a part of the semiconductor device 300. Specifically, the lengths L1 of the $1^{st}$ nanosheet layers are greater than the lengths L2 of the $2^{nd}$ nanosheet layers. However, the inventive concept is not limited thereto. According to embodiments, the $1^{st}$ and $2^{nd}$ channel sets 310 and 320 may be configured such that a length of a nanosheet layer having the greatest length among the $2^{nd}$ nanosheet layers may be smaller than a length of a nanosheet layer having the smallest length among the $1^{st}$ nanosheet layers.

Herein, the $1^{st}$ and the $2^{nd}$ transistors 301 and 302 may be an NMOS and a PMOS, respectively, to form an inverter circuit of which the schematic is shown in FIG. 3F, according to an embodiment, and the descriptions below are based on this embodiment. However, the inventive concept is not limited thereto. According to an embodiment, the $1^{st}$ and $2^{nd}$ transistors 301 and 302 may be a PMOS and an NMOS, respectively, or both a PMOS or an NMOS to form a different circuit element.

The $2^{nd}$ transistor 302 is stacked above the $1^{st}$ transistor 301 with an isolation layer 330 therebetween. The isolation layer 330 is formed between the $1^{st}$ channel set 310 and the $2^{nd}$ channel set 320 to isolate the two transistors 301 and 302. The isolation layer 330 may be formed of SiO or silicon dioxide ($SiO_2$), not being limited thereto.

Each of the $1^{st}$ gate structure 315 and the $2^{nd}$ gate structure 325 is formed by replacing a dummy gate structure filled between and surrounding the $1^{st}$ and $2^{nd}$ nanosheet layers in an early step of a manufacturing process of the semiconductor device 300.

A $1^{st}$ source/drain region 311 and a $2^{nd}$ source/drain region 312 are formed at both ends of the $1^{st}$ channel set 310 of the $1^{st}$ nanosheet layers in the D2 direction, respectively, to constitute the $1^{st}$ transistor 301, and a $3^{rd}$ source/drain region 313 and a $4^{th}$ source/drain region 314 are formed at both ends of the $2^{nd}$ channel set 320 of the $2^{nd}$ nanosheet layers in the same D2 direction, respectively, to constitute the $2^{nd}$ transistor 302. The $1^{st}$ source/drain region 311 and the $2^{nd}$ source/drain region 312 may be formed by epitaxially growing silicon layers of the $1^{st}$ nanosheet layers of the $1^{st}$ channel set 310 where the $1^{st}$ nanosheet layers are not surrounded by the $1^{st}$ gate structure 315. The $3^{rd}$ source/drain region 313 and the $4^{th}$ source/drain region 314 may be formed by epitaxially growing silicon layers of the $2^{nd}$ nanosheet layers of the $2^{nd}$ channel set 320 where the $2^{nd}$ nanosheet layers are not surrounded by the $2^{nd}$ gate structure 325.

Referring back to FIGS. 3A to 3E, the $1^{st}$ channel set 310 has two nanosheet layers, and the $2^{nd}$ channel set 320 has three nanosheet layers to form the respective transistors 301 and 302 of an inverter circuit. This difference of the number of nanosheet layers in the two channel sets 310 and 320 is caused by the dimensional difference between the $1^{st}$ nanosheet layers included in the $1^{st}$ channel set 310 and the $2^{nd}$ nanosheet layers included in the $2^{nd}$ channel set 320. Specifically, since the widths W2 of the $2^{nd}$ nanosheet layers included in the $2^{nd}$ channel set 320 are shorter than the $1^{st}$ nanosheet layers included in the $1^{st}$ channel set 310, the $2^{nd}$ channel set 320 has an additional nanosheet layer than the $1^{st}$ channel set 310 so that the $1^{st}$ channel set 310 and the $2^{nd}$ channel set 320 can have a substantially same $W_{eff}$. Thus, according to the width difference between the $1^{st}$ nanosheet layers in the $1^{st}$ channel set 310 and the $2^{nd}$ nanosheet layers in the $2^{nd}$ channel set 320, the $2^{nd}$ channel set 320 may have one or more nanosheet layers than the $1^{st}$ channel set 310, according to embodiments.

Meanwhile, as the $2^{nd}$ nanosheet layers in the $2^{nd}$ channel set 320 have smaller widths than the $1^{st}$ nanosheet layers in the $1^{st}$ channel set 310, the $3^{rd}$ source/drain region 313 and the $4^{th}$ source/drain region 314 can be formed to have a width W4 which is smaller than a width W3 of the $1^{st}$ source/drain region 311 and the $2^{nd}$ source/drain region 312, respectively, according to an embodiment.

FIGS. 3A to 3E also show that the semiconductor device 300 includes $1^{st}$ to $3^{rd}$ source/drain contact structures 321 to 323, $1^{st}$ to $3^{rd}$ and $5^{th}$ via structures 331 to 333 and 335, and $1^{st}$ to $5^{th}$ metal patterns 341 to 345 arranged in the D1 direction with a predetermined interval, according to an embodiment.

The $1^{st}$ source/drain contact structure 321 is extended from the $1^{st}$ metal pattern 341 providing a negative supply voltage (Vss) through the $1^{st}$ via structure 331, and connected to the $1^{st}$ source/drain region 311 of the $1^{st}$ transistor 301. Thus, the $1^{st}$ source/drain region 311 may function as a source of the transistor 301, which may be an NMOS.

The $2^{nd}$ source/drain contact structure 322 is connected to both the $2^{nd}$ source/drain region 312 of the $1^{st}$ transistor 301 and the $4^{th}$ source/drain region 314 of the $2^{nd}$ transistor 302 through the $2^{nd}$ via structure 332, according to an embodiment, because the two transistors 301 and 302 form an inverter circuit having a common output node $V_{out}$ as shown in FIG. 3F. Here, the $2^{nd}$ source/drain region 312 functions as a drain of the transistor 301 (NMOS), and the $4^{th}$ source/drain region 314 functions as a drain of the transistor 302 (PMOS).

The $3^{rd}$ source/drain contact structure 323 is extended from the $5^{th}$ metal pattern 345 providing a positive supply voltage (Vdd) through the $5^{th}$ via structure 335, and connected to the $3^{rd}$ source/drain region 313 of the $2^{nd}$ transistor 302. Thus, the $3^{rd}$ source/drain region 313 may function as a source of the transistor 302 (PMOS).

Referring to FIGS. 3A and 3D, the $2^{nd}$ source/drain contact structure 322 is extended from the $2^{nd}$ metal pattern 342 through the $2^{nd}$ via structure 332 straight downward to pass through a side surface of the $4^{th}$ source/drain region 314 and land on the $2^{nd}$ source/drain region 312. This straight downward connection of the $2^{nd}$ source/drain contact structure 322 to both of the $2^{nd}$ and $4^{th}$ source/drain regions 312 and 314 is enabled due to the smaller width of the $4^{th}$ source/drain region 314 caused by the smaller widths of the $2^{nd}$ nanosheet layers of the $2^{nd}$ channel set 320, as described above. Otherwise, when the widths W2 of the $2^{nd}$ nanosheet layers of the $2^{nd}$ channel set 320 are not smaller than the widths W1 of the $1^{st}$ nanosheet layers of the channel set 310, and thus, the width W4 of the $4^{th}$ source/drain region 314 is not smaller than the width W3 of the $2^{nd}$ source/drain region 312, it may be complicated to form the $2^{nd}$ source/drain contact structure 322 as discussed in the previous embodiment in FIG. 2B. In other words, as the $2^{nd}$ source/drain contact structure 322 connected from the $2^{nd}$ metal pattern 342 can be extended straight downward to land only on the $4^{th}$ source/drain region 314, an additional source/drain contact structure connected from another metal pattern formed above the $4^{th}$ source/drain region 322 may have to be bent to be connected to the $2^{nd}$ source/drain region 312 as shown in FIG. 2B, or a separate metal structure connecting the $2^{nd}$ source/drain region and the $4^{th}$ source/drain region will be required, unless the additional source/drain contact structure is buried in the substrate 305, thereby to make a process of manufacturing the semiconductor device 300 more complicated.

The foregoing structural characteristics of the semiconductor device 300 are evident from FIGS. 3A and 3E, which shows that the $1^{st}$ source/drain contact structure 321 is extended from the $1^{st}$ metal pattern 341 through the $1^{st}$ via structure 331 straight downward to land on the $1^{st}$ source/drain region 311 taking advantage of the space allowed by the smaller widths of the $3^{rd}$ source/drain region 313. Thus, like the $2^{nd}$ source/drain contact structure 322, the $1^{st}$ source/drain contact structure 321 also does not have to be bent or buried in the substrate 305.

According to embodiments, the widths maybe differently set between the $1^{st}$ nanosheet layers in the $1^{st}$ channel set 310 and between the $2^{nd}$ nanosheet layers in the $2^{nd}$ channel set 320 as long as the $4^{th}$ source/drain region 314 can have a smaller width than the $2^{nd}$ source/drain region 312 so that the $2^{nd}$ source/drain contact structure 322 can be extended straight downward to land on a top surface on the $2^{nd}$ source/drain region 312 with making a lateral contact on a side surface of the $4^{th}$ source/drain region 314 as described above in reference to FIGS. 3A and 3D. For example, the $2^{nd}$ nanosheet layers may have a much smaller width than the $1^{st}$ nanosheet layers, in which case the $2^{nd}$ channel set 320 may have more $2^{nd}$ nanosheet layers, to allow more space for source/drain contact structure connection. Specifically, when it is not necessary for the $2^{nd}$ source/drain contact structure 322 to be connected to both the $2^{nd}$ and $4^{th}$ source/drain regions 312 and 314, for example, when the $1^{st}$ and $2^{nd}$ transistors 301 and 302 constitutes a circuit different from an inverter circuit, the $2^{nd}$ source/drain contact structure 322 may be formed not to make a lateral contact on the side surface of the $4^{th}$ source/drain region 314 of the $2^{nd}$ transistor 302 but to make a direct straight downward contact on the top surface of the $2^{nd}$ source/drain region 312 of the $1^{st}$ transistor 301. In this case, another source/drain contact structure may land on a top surface of the $4^{th}$ source/drain region 314.

In addition, according to embodiments, other dimensions such as lengths as well as the widths may be differently set between the $1^{st}$ nanosheet layers in the $1^{st}$ channel set 310 and between the $2^{nd}$ nanosheet layers in the $2^{nd}$ channel set 320 as long as the $4^{th}$ source/drain region 314 can have a smaller width than the $2^{nd}$ source/drain region 312 so that the $2^{nd}$ source/drain contact structure 322 can be extended straight downward to be connected to the $2^{nd}$ source/drain region 312 with or without passing through $4^{th}$ source/drain region 314 as described above, and further, as long as the $1^{st}$ and $2^{nd}$ channel sets can have the substantially same $W_{eff}$.

FIGS. 3A to 3F further shows that, in order to form an inverter circuit of which the schematic is shown in FIG. 3F, the $1^{st}$ gate structure 315 of the $1^{st}$ transistor 301 and the $2^{nd}$ gate structure 325 of the $2^{nd}$ transistor 302 are connected to each other to receive a same gate input signal from the $3^{rd}$ metal pattern 343 through the $3^{rd}$ via structure 333.

Meanwhile, FIGS. 3A and 3B show extended channel sections of the $1^{st}$ and $2^{nd}$ channel sets 310 and 320 at both ends thereof in the D2 direction. These extended channel sections are provided to constitute additional semiconductor devices other than the inverter. Accordingly, the $4^{th}$ metal pattern 344 may be reserved for connection with one or more elements of the other semiconductor devices covered by the semiconductor device 300.

Figure 4:
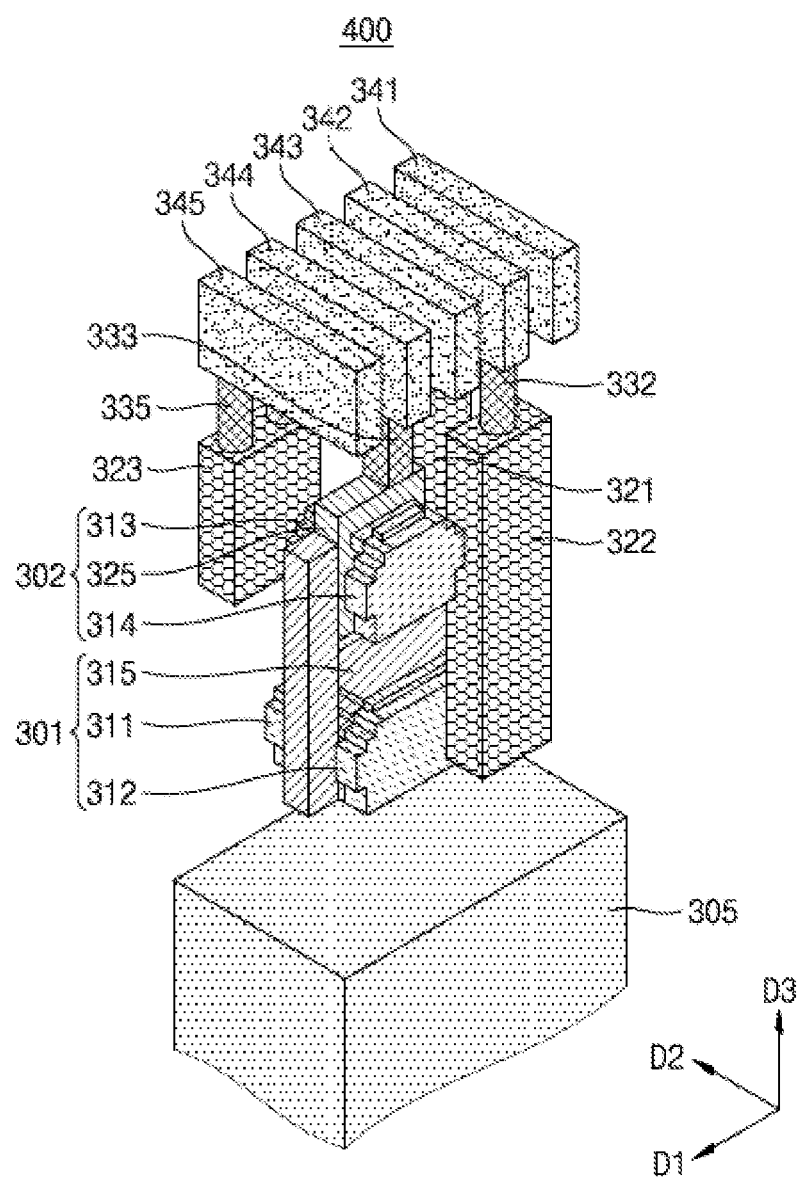
FIG. 4 illustrates a perspective view of an inverter structure included in a semiconductor device having a multi-stack nanosheet structure, according to an embodiment.

FIG. 4 illustrates a perspective view of an inverter structure included in a semiconductor device formed by two sets of nanosheet layers, according to an embodiment.

An inverter structure 400 shown in FIG. 4 is a perspective view seen from an opposite direction of the inverter part of the semiconductor device 300 shown in FIG. 3A.

The inverter structure 400 includes the $1^{st}$ channel set 310 of a plurality of $1^{st}$ nanosheet layers and the $2^{nd}$ channel set 320 of a plurality of $2^{nd}$ nanosheet layers formed above the substrate 305 to form the transistor 301 (NMOS) and the transistor 402 (PMOS), respectively. The $1^{st}$ nanosheet layers are surrounded by the $1^{st}$ gate structure 315, and the $2^{nd}$ nanosheet layers are surrounded by the $2^{nd}$ gate structure 325. The $1^{st}$ to $4^{th}$ source/drain regions 311 to 314 are connected to both ends of the $1^{st}$ channel set 310 and both ends of the $2^{nd}$ channel set 320, respectively, in the D2 direction. Here, it is understood that, as these $1^{st}$ to $4^{th}$ source/drain regions 311 to 314 cover the $1^{st}$ and $2^{nd}$ nanosheet layers, respectively, the $1^{st}$ and $2^{nd}$ nanosheet layers are not seen in FIG. 4 which illustrates only a perspective view of the inverter part of the semiconductor device 300. The inverter structure 400 further includes the $1^{st}$ to $3^{rd}$ source/drain contact structures 321 to 323, the $1^{st}$ to $3^{rd}$ and $5^{th}$ via structures 331 to 333 and 335, and the $1^{st}$ to $5^{th}$ metal patterns 341 to 345 arranged in the D1 direction with a predetermined interval.

Figure 5A:
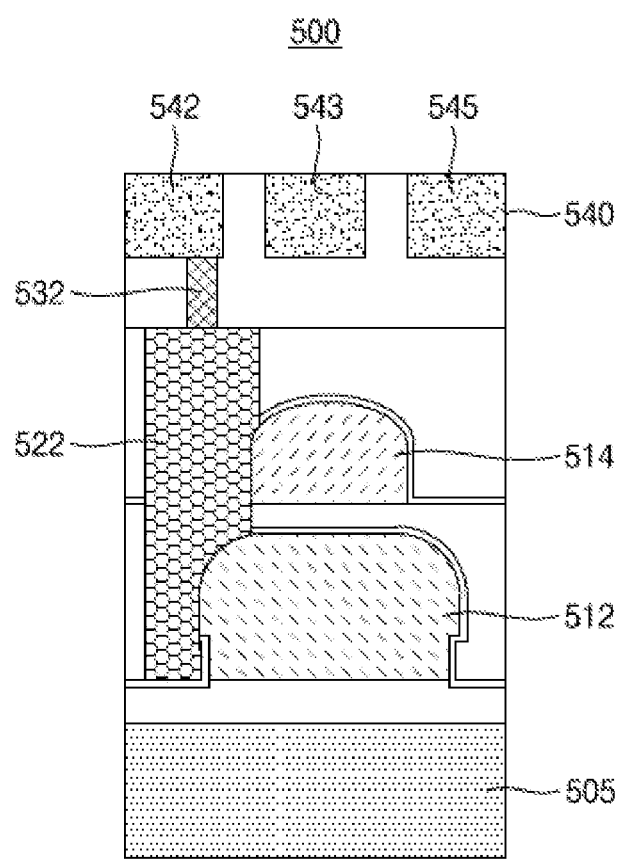
FIGS. 5A to 5C illustrate respective views of cross-sections of another semiconductor device including a multi-stack nanosheet structure, according to an embodiment.
Figure 5B:
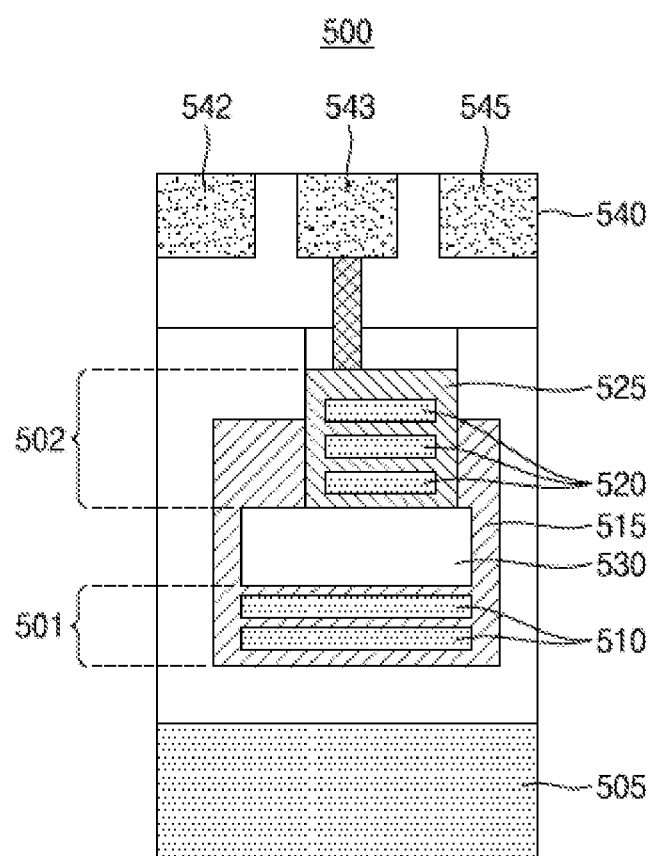
Figure 5C:
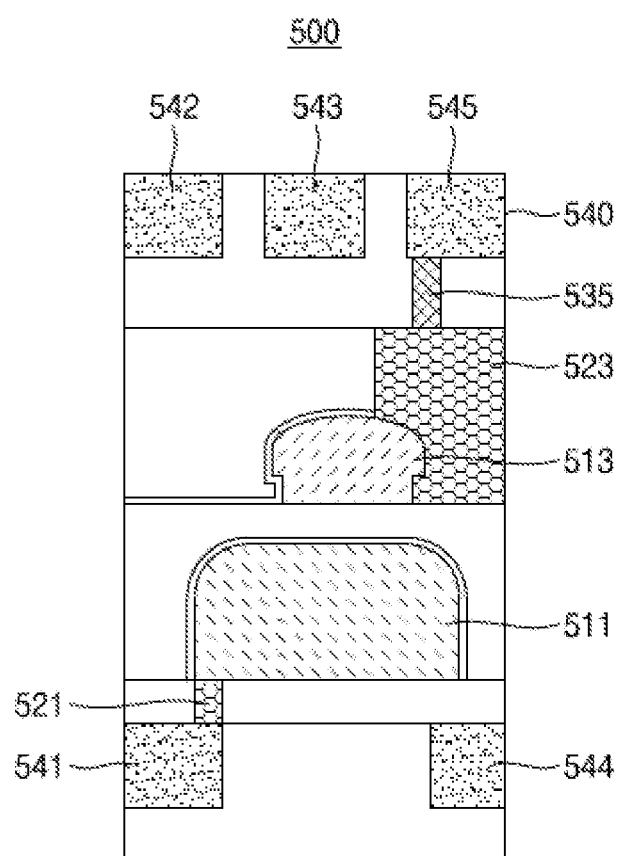

FIGS. 5A to 5C illustrate respective views of cross-sections of another semiconductor device including a multi-stack nanosheet structure, according to an embodiment. FIGS. 5A to 5C correspond to FIGS. 3C to 3E.

Referring to FIGS. 5A to 5C, a semiconductor device 500 according to an embodiment includes a $1^{st}$ channel set 510 of a plurality of $1^{st}$ nanosheet layers, and a $2^{nd}$ channel set 520 of a plurality of $2^{nd}$ nanosheet layers formed above a substrate 505 to form an NMOS 501 and a PMOS 502, respectively. Each of the $1^{st}$ nanosheet layers is surrounded by a $1^{st}$ gate structure 515, and each of the $2^{nd}$ nanosheet layers is surrounded by a $2^{nd}$ gate structure 525. $1^{st}$ to $4^{th}$ source/drain regions 511 to 514 are connected to both ends of the $1^{st}$ channel set 510 and both ends of the $2^{nd}$ channel set 520, respectively, in the D2 direction. Here, it is understood that, since these $1^{st}$ to $4^{th}$ source/drain regions 511 to 514 may be epitaxially grown from the $1^{st}$ and $2^{nd}$ nanosheet layers, respectively, the $1^{st}$ and $2^{nd}$ nanosheet layers are not seen in FIGS. 5A and 5C which are only respectively cross-section views. The above-described elements of the semiconductor device 500 have the same structural characteristics, including smaller widths of the $2^{nd}$ nanosheet layers and the smaller widths of the $3^{rd}$ and $4^{th}$ source/drain regions 513 and 514, as those of the semiconductor device 300 shown in FIGS. 3A to 3E. Thus, detailed descriptions thereof are omitted herein.

However, the semiconductor device 500 differs from the semiconductor device 300 at its source/drain contact structures, via structures and metal patterns as describe below.

While all metal patterns 341 to 345 are formed at a metal layer 340 disposed at the top of the semiconductor device 300, only $2^{nd}$, $3^{rd}$ and $5^{th}$ metal patterns 542, 543 and 545 are formed at a metal layer 540 disposed at the top of the semiconductor device 500, and instead, $1^{st}$ and $4^{th}$ metal patterns 541 and 544 are buried in the substrate 505.

Due to these structural characteristics, a $1^{st}$ source/drain contact structure 521 can be extended straight upward from the $1^{st}$ metal pattern 541 buried in the substrate 505. The $1^{st}$ metal pattern 541 provides a negative supply voltage (Vss) to the $1^{st}$ source/drain region 511 of the NMOS 501 through the $1^{st}$ source/drain contact structure 521. Like in the semiconductor device 300 shown in FIGS. 3A to 3E, the $4^{th}$ metal pattern 544 is reserved for connection with one or more elements of other semiconductor devices covered by the semiconductor device 500.

In contrast, a $2^{nd}$ source/drain contact structure 522 connected from the $2^{nd}$ metal pattern 542 is extended straight downward to pass through a side surface of the $4^{th}$ source/drain region 514 and land on the $2^{nd}$ source/drain region 512. As in the previous embodiment of FIGS. 3A to 3E, this straight downward connection of the $2^{nd}$ source/drain contact structure 522 to both of the $2^{nd}$ and $4^{th}$ source/drain regions 512 and 514 is enabled due to the smaller width of the $4^{th}$ source/drain region 514 caused by the smaller widths of the $2^{nd}$ nanosheet layers.

A $3^{rd}$ source/drain contact structure 523 is extended from the $5^{th}$ metal pattern 545 providing a positive supply voltage (Vdd) through the $5^{th}$ via structure 535, and connected to the $3^{rd}$ source/drain region 513 of the PMOS 502.

The $3^{rd}$ metal pattern 543 provides a gate input signal to the $1^{st}$ and $2^{nd}$ gate structures 515 and 525 through the $3^{rd}$ via structure 533.

With the above structural difference, the semiconductor device 500 may be manufactured at only two metal pitches between the $2^{nd}$, $3^{rd}$ and $5^{th}$ metal patterns 542, 543 and 545 while the semiconductor device 300 requires four metal pitches between the $1^{st}$ to $5^{th}$ metal patterns 341 to 345.

In the above embodiments, the semiconductor devices 300, 500 and the inverter structure 400 have only two channel sets each of which is formed of a plurality of nanosheet layers. However, the inventive concept is not limited thereto, and more than two channel sets can be stacked to constitute different semiconductor devices, in which the lowest positioned channel set and a source/drain region connected to this channel set is not entirely overlapped by the upper positioned channel sets and source/drain regions connected to these channel set, according to embodiments.

Also, in the above embodiments, each channel set of the semiconductor devices is formed of a plurality of nanosheet layers. However, the inventive concept is not limited thereto. A hybrid nanosheet structure maybe provided according to an embodiment as described below.

Figure 6:
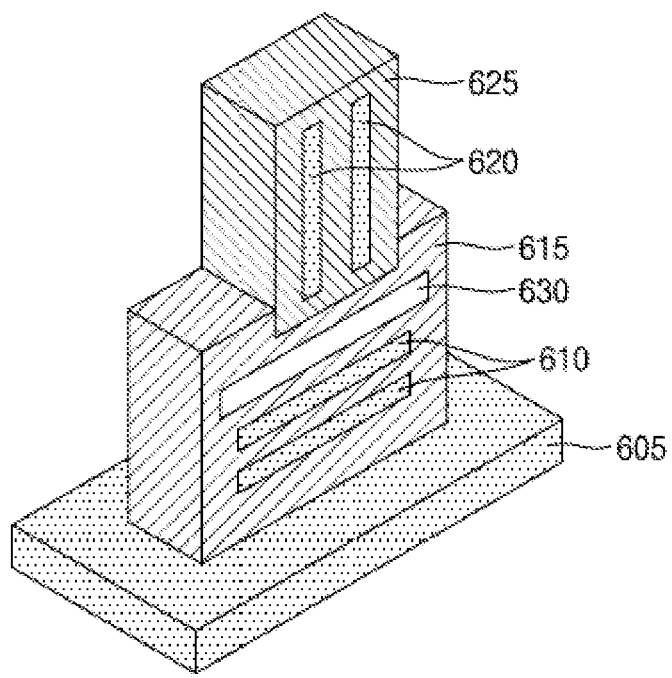
FIG. 6 illustrates a hybrid nanosheet structure according to an embodiment.

FIG. 6 illustrates a hybrid semiconductor device according to an embodiment.

A hybrid semiconductor device 600 according to an embodiment includes a $1^{st}$ channel set 610 of a plurality of nanosheet layers in a lower stack of the semiconductor device 500. Like the nanosheet layers of the $1^{st}$ channel set 210 of FIG. 2A, the nanosheet layers of the $1^{st}$ channel set 610 in the lower stack of the hybrid semiconductor device 600 are completely surrounded by a $1^{st}$ gate structure 615 except at their open ends formed at two opposite sides of the gate structure 615 where lower source/drain regions are to be grown to build a lower transistor. However, the hybrid semiconductor device 600 includes a $2^{nd}$ channel set 620 formed of a plurality of finFET channel layers, that is, fin structures, which is different from the $2^{nd}$ channel set 220 of FIG. 2A. Each of the finFET channel layers is not completely surrounded by a $2^{nd}$ gate structure 625, and instead, a bottom surface of each finFET channel layer contacts an isolation layer 630 or another silicon substrate. However, source/drain regions may be formed at open ends of the finFET channel layers formed at two opposite sides of the $2^{nd}$ gate structure 625 by implementing epitaxy on the finFET channel layers to constitute an upper transistor.

Still, however, the inventive concept described above in reference to FIGS. 3A to 3F, 4 and 5A to 5C may apply to the hybrid semiconductor device 600. Thus, according to embodiments, the hybrid semiconductor device 600 may replace the nanosheet structure shown in FIGS. 3A to 3E or FIGS. 5A to 5C to build a hybrid semiconductor device corresponding to the semiconductor device 300 or 500. Specifically, by adjusting the widths, pitch, height and/or the number of the finFET channel layers, that is, the fin structures, of the $2^{nd}$ channel set 620, the widths of source/drain regions of the upper transistor formed from the $2^{nd}$ channel set 620 may be made smaller than the widths of source/drain regions of the lower transistor formed from the $1^{st}$ channel set 610. Accordingly, substantially same source/drain contact structures explained in the previous embodiments shown in FIGS. 3A to 3E and FIGS. 5A to 5C may be obtained to achieve direct straight downward connections from metal patterns of the BEOL to one of the source/drain regions of the lower transistor, in a substantially same manner shown in FIGS. 3D and 5A.

The inventive concept may be further applied to different types of hybrid semiconductor device, according to embodiments. For example, in a hybrid semiconductor device according to an embodiment, the upper stack $1^{st}$ channel set 610 of the finFET channel layers and the lower stack $2^{nd}$ channel set 620 of the nanosheet layers shown in FIG. 6 may be respectively formed at lower and upper stacks of the hybrid semiconductor device in a manner opposite to the embodiment shown in FIG. 6. In addition, in a hybrid semiconductor device according to an embodiment, the upper stack $1^{st}$ channel set 610 of the finFET channel layers shown in FIG. 6 may be formed at both of lower and upper stacks of the hybrid semiconductor device. Still in these embodiments, the width, pitch, height and/or number of the channel layers of the lower and/or upper stack transistor structure may be adjusted in relation with the lower stack transistor to achieve the same inventive concept described above.

Figure 7:
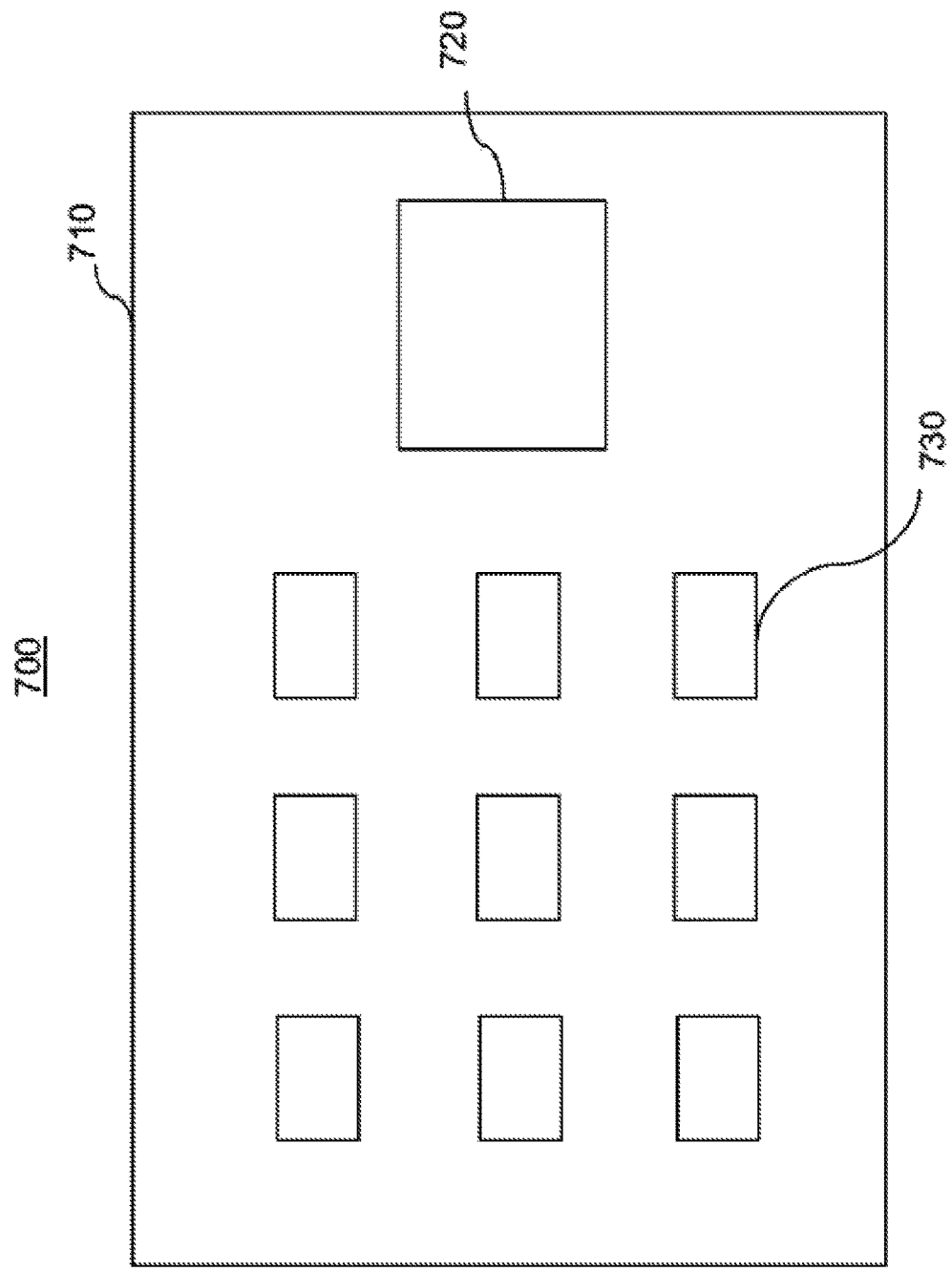
FIG. 7 illustrates a schematic plan view of a semiconductor module according to an embodiment.

FIG. 7 illustrates a schematic plan view of a semiconductor module according to an embodiment.

Referring to FIG. 7, a semiconductor module 700 according to an embodiment may include a processor 720 and semiconductor devices 730 that are mounted on a module substrate 710. The processor 720 and/or the semiconductor devices 730 may include one or more multi-stack transistor structures described in the above embodiments.

Figure 8:
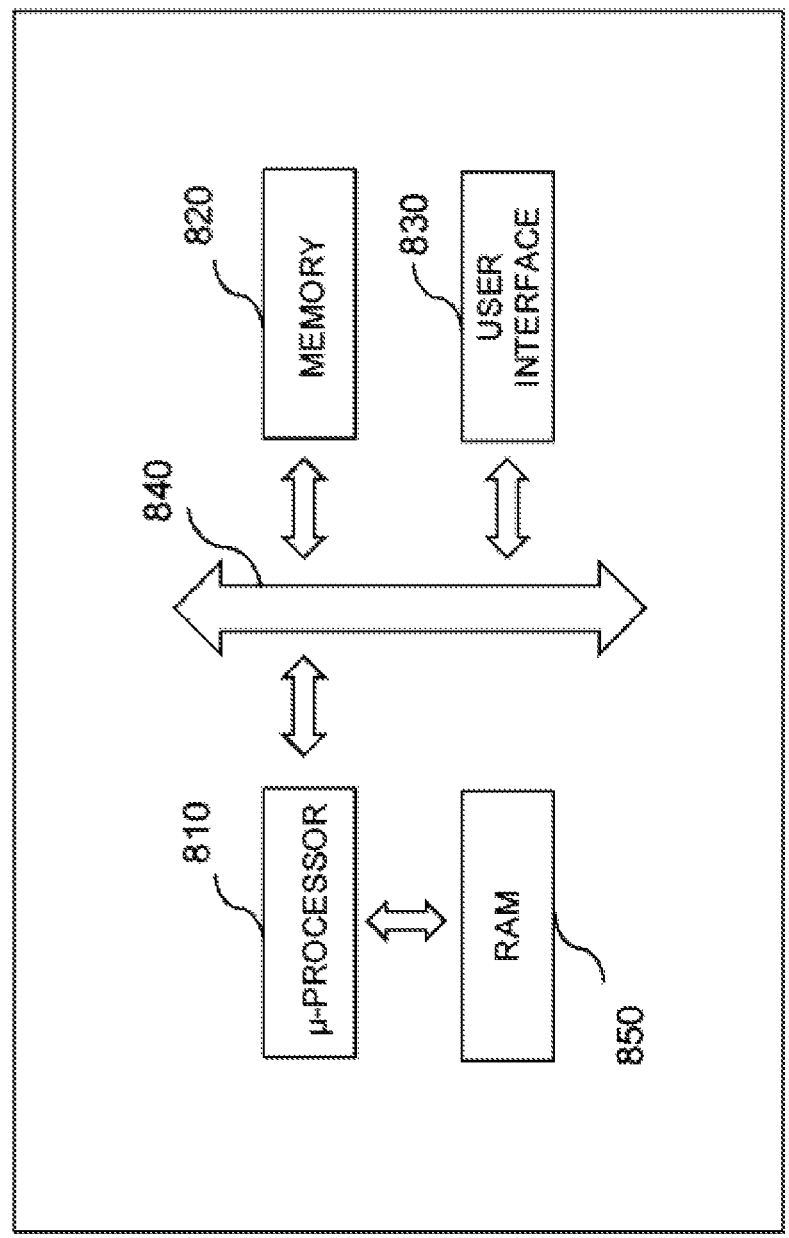
FIG. 8 illustrates a schematic block diagram of an electronic system according to an embodiment.

FIG. 8 illustrates a schematic block diagram of an electronic system according to an embodiment.

Referring to FIG. 8, an electronic system 800 in accordance with an embodiment may include a microprocessor 810, a memory 820, and a user interface 830 that perform data communication using a bus 840. The microprocessor 810 may include a central processing unit (CPU) or an application processor (AP). The electronic system 800 may further include a random access memory (RAM) 850 in direct communication with the microprocessor 810. The microprocessor 810 and/or the RAM 850 may be implemented in a single module or package. The user interface 830 may be used to input data to the electronic system 800, or output data from the electronic system 800. For example, the user interface 830 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 820 may store operational codes of the microprocessor 810, data processed by the microprocessor 810, or data received from an external device. The memory 820 may include a memory controller, a hard disk, or a solid state drive (SSD).

At least the microprocessor 810, the memory 820 and/or the RAM 850 in the electronic system 800 may include one or more multi-stack transistor structures described in the above embodiments.

Due to the difference between structural dimensional such as widths of channel layers between multiple stacks in above-described multi-stack transistor structures, it is possible to obtain a more space for direct and straight connections of source/drain contact structure with source/drain regions of multi-stack transistors in a semiconductor device during manufacturing of the semiconductor device. Further, when a metal pattern connected from a power source is buried in a substrate of the multi-stack transistors, metal pitches may be reduced to reduce the size of the semiconductor device.

The foregoing is illustrative of example embodiments and is not to be construed as limiting thereof. Although a few example embodiments have been described, those skilled in the art will readily appreciate that many modifications are possible in the above embodiments without materially departing from the inventive concept.

What is claimed is:

1. A semiconductor device comprising:
   a substrate;
   a $1^{st}$ transistor formed above the substrate, the $1^{st}$ transistor comprising a $1^{st}$ channel set of a plurality of $1^{st}$ nanosheet layers, a $1^{st}$ gate structure surrounding the $1^{st}$ nanosheet layers, and $1^{st}$ and $2^{nd}$ source/drain regions at both ends of the $1^{st}$ channel set; and
   a $2^{nd}$ transistor formed above the $1^{st}$ transistor in a vertical direction, the $2^{nd}$ transistor comprising a $2^{nd}$ channel set of a plurality of $2^{nd}$ nanosheet layers, a $2^{nd}$ gate structure surrounding the $2^{nd}$ nanosheet layers, and $3^{rd}$ and $4^{th}$ source/drain regions at both ends of the $2^{nd}$ channel set;
   wherein the $2^{nd}$ source/drain region has a greater width than the $4^{th}$ source/drain region in a channel width direction so that the $4^{th}$ source/drain region vertically overlaps only a part of the $2^{nd}$ source/drain region, the channel width direction being perpendicular to a channel length direction in which the $1^{st}$ and $2^{nd}$ source/drain regions are connected though the $1^{st}$ channel set and the $3^{rd}$ and $4^{th}$ source/drain regions are connected though the $2^{nd}$ channel set, and
   wherein a sum of effective channel widths of the $1^{st}$ nanosheet layers is substantially equal to a sum of effective channel width of the $2^{nd}$ nanosheet layers.

2. The semiconductor device of claim 1, wherein the $1^{st}$ source/drain region has a greater width than the $3^{rd}$ source/drain region.

3. The semiconductor device of claim 1, wherein the $1^{st}$ nanosheet layers have a greater width than the $2^{nd}$ nanosheet layers, and
   wherein the $2^{nd}$ channel set vertically overlaps only a part of the $1^{st}$ channel set.

4. The semiconductor device of claim 1, wherein a width of a $2^{nd}$ nanosheet layer having a greatest width among the $2^{nd}$ nanosheet layers is smaller than a width of a $1^{st}$ nanosheet layer having a smallest width among the $1^{st}$ nanosheet layers.

5. The semiconductor device of claim 4, wherein a number of the $2^{nd}$ nanosheet layers is greater than a number of the $1^{st}$ nanosheet layers.

6. The semiconductor device of claim 5, further comprising:
   a gate contact structure connected to at least the $2^{nd}$ gate structure;
   a $1^{st}$ source/drain contact structure connected the $1^{st}$ source/drain region;
   a $2^{nd}$ source/drain contact structure which is the source/drain contact structure connected to the $2^{nd}$ source/drain region through the space where the $4^{th}$ source/drain region does not vertically overlap the $2^{nd}$ source/drain region; and
   a $3^{rd}$ source/drain contact structure connected to the $3^{rd}$ source/drain region,
   wherein the $2^{nd}$ source/drain contact structure laterally contacts a side surface of the $4^{th}$ source/drain region and contacts a top surface of the $2^{nd}$ source/drain region.

7. The semiconductor device of claim 6, further comprising $1^{st}$ to $4^{th}$ metal patterns formed above the $2^{nd}$ transistor,
   wherein the $1^{st}$ metal pattern is connected to the $1^{st}$ source/drain contact structure to provide one of a positive supply voltage and a negative supply voltage,
   wherein the $2^{nd}$ metal pattern is connected to the $2^{nd}$ source/drain contact structure,
   wherein the $3^{rd}$ metal pattern is connected to the gate contact structure, and
   wherein the $4^{th}$ metal pattern is connected to the $3^{rd}$ source/drain contact structure to provide the other of the positive supply voltage and the negative supply voltage.

8. The semiconductor device of claim 7, further comprising a $5^{th}$ metal pattern formed above the $2^{nd}$ transistor, and reserved for connection with another circuit element not included in the $1^{st}$ and $2^{nd}$ transistors.

9. The semiconductor device of claim 6, further comprising a $1^{st}$ metal pattern buried in the substrate, and $2^{nd}$, $3^{rd}$ and $4^{th}$ metal patterns formed above the $2^{nd}$ transistor,
   wherein the $1^{st}$ metal pattern is connected to the $1^{st}$ source/drain contact structure to provide one of a positive supply voltage and a negative supply voltage,
   wherein the $2^{nd}$ metal pattern is connected to the $2^{nd}$ source/drain contact structure,
   wherein the $3^{rd}$ metal pattern is connected to the gate contact structure, and
   wherein the $4^{th}$ metal pattern is connected to the $3^{rd}$ source/drain contact structure to provide the other of the positive supply voltage and the negative supply voltage.

10. The semiconductor device of claim 9, wherein the $1^{st}$ and $2^{nd}$ transistors form an inverter having a size of two metal pitches in a channel width direction.

11. A semiconductor device comprising:
    a substrate;
    a $1^{st}$ transistor formed above the substrate, the $1^{st}$ transistor comprising at least two $1^{st}$ channel layers and $1^{st}$ and $2^{nd}$ source/drain regions; and
    a $2^{nd}$ transistor stacked above the $1^{st}$ transistor in a vertical direction, the $2^{nd}$ transistor comprising at least two $2^{nd}$ channel layers and $3^{rd}$ and $4^{th}$ source/drain regions;
    wherein the $2^{nd}$ source/drain region is partially overlapped by the $4^{th}$ source/drain region in a vertical direction,
    wherein at least one of the two $1^{st}$ channel layers is not vertically overlapped by any one of the $2^{nd}$ channel layers, and
    wherein a sum of effective channel widths of the $1^{st}$ channel layers is substantially equal to a sum of effective channel width of the $2^{nd}$ channel layers.

12. The semiconductor device of claim 11, wherein the $1^{st}$ channel layers are nanosheet channels, and the $2^{nd}$ channel layers are finFET channel layers.

13. The semiconductor device of claim 11, wherein the $2^{nd}$ source/drain region has a greater width than the $4^{th}$ source/drain region in a channel width direction.

14. The semiconductor device of claim 13, wherein the $1^{st}$ source/drain region has a greater width than the $3^{rd}$ source/drain region.

* * * * *